United States Patent [19]

Olsen et al.

[11] 4,359,774

[45] Nov. 16, 1982

[54] LIGHT EMITTING DEVICE

[75] Inventors: Gregory H. Olsen, Plainsboro; Dan Botez, Mt. Holly, both of N.J.

[73] Assignee: RCA Corporation, New York, N.Y.

[21] Appl. No.: 204,056

[22] Filed: Nov. 4, 1980

[51] Int. Cl.³ ............................................... H01S 3/19
[52] U.S. Cl. ....................................... 372/45; 357/17
[58] Field of Search ................... 331/94.5 H; 357/17, 357/18; 372/45, 46

[56] References Cited

U.S. PATENT DOCUMENTS

| | | | |
|---|---|---|---|
| 3,747,016 | 7/1973 | Kressel et al. | 331/94.5 H |
| 3,753,801 | 8/1973 | Lockwood et al. | 148/171 |
| 3,982,261 | 9/1976 | Antypas | 357/16 |
| 4,092,659 | 5/1978 | Ettenberg | 357/18 |
| 4,116,733 | 9/1978 | Olsen et al. | 148/175 |
| 4,178,564 | 12/1979 | Ladany et al. | 331/94.5 H |
| 4,233,090 | 11/1980 | Howrylo et al. | 331/94.5 H |
| 4,328,469 | 5/1982 | Scifres et al. | 372/45 |

OTHER PUBLICATIONS

Ettenberg et al., "Very High Radiance Edge-Emitting LED", IEEE Journal of Quantum Electronics, vol. QE12, No. 6, Jun. 1976, pp. 360-364.
Utaka et al., "Room Temperature Operation of GaInAsP/InP Integrated Twin-Guide Lasers with First-Order Distributed Bragg Reflector", Conference: *Integrated and Guided-Wave Optics.*
Technical Digest, Incline Village, NV, USA, 28-30 Jan. 1980, pp. MC5-1-MC5-4.
Olsen et al., "InGaAsP Quaternary Alloys: Composition, Refractive Index and Lattice Mismatch", *Journal of Electronic Materials*, vol. 9, No. 6, 1980, pp. 977-987.

*Primary Examiner*—James W. Davie
*Attorney, Agent, or Firm*—Birgit E. Morris; Donald S. Cohen; William J. Burke

[57] ABSTRACT

A light emitting device comprises a substrate, a first confining layer overlying the substrate, an active layer overlying the first confining layer, a second confining layer overlying the active layer and a capping layer overlying the second confining layer. The improvement is the interposition of an absorber layer which absorbs light at the wavelength of the emission between the substrate and the first confining layer and a capping layer which absorbs light at the wavelength of the emission. The improved device exhibits an output beam which has a narrow angular intensity pattern in the plane perpendicular to the plane of the layers and to the end surfaces of the device.

9 Claims, 2 Drawing Figures

LIGHT EMITTING DEVICE

The Government has rights in this invention pursuant to Contract No. F19628-79-C-0115 awarded by the Department of the Air Force.

The invention is a light emitting device having an improved angular output beam intensity pattern in the plane perpendicular to the plane of the layers and to the end surfaces of the device.

BACKGROUND OF THE INVENTION

Kressel et al in U.S. Pat. No. 3,747,016 issued July 17, 1973 and entitled "SEMICONDUCTOR INJECTION LASER", have disclosed a light emitting device composed of an active layer interposed between transparent confining layers having a lower index of refraction than that of the active layer. Typically this device is fabricated with a GaAs substrate and active region and AlGaAs upper and lower confining layers. A GaAs capping layer overlies the upper confining layer for contacting purposes. Ettenburg et al, in IEEE Journal of Quantum Electronics QE-12, 360 (1976), have disclosed that a light beam propagating in the active region spreads into the transparent confining layers as the active region is narrowed to less than about 0.1 micrometer in the direction perpendicular to the plane of the layers. Since the crossection of the beam at the end surface is then larger, the angular divergence of the emitted light beam from diffraction effects is then reduced.

Antypas in U.S. Pat. No. 3,982,261 issued Sept. 21, 1976 and entitled "EPITAXIAL INDIUM-GALLIUM-ARSENIDE PHOSPHIDE LAYER ON LATTICE-MATCHED INDIUM-PHOSPHIDE SUBSTRATE AND DEVICES" has disclosed that a light emitting device can be fabricated using an InGaAsP alloy as the active layer and InP as the confining layers. This device emits radiation at wavelengths between about 1.2 micrometers and about 1.7 micrometers depending upon the relative concentration of the constituents of the InGaAsP alloy while maintaining the lattice match to the InP layers. The device is typically composed of an InP substrate, an InP lower confining layer, an InGaAsP active layer, an InP upper confining layer, and an InGaAsP capping layer for contacting purposes.

We have found that, as the thickness of the active layer is reduced below about 0.1 micrometer in this device, the output beam quality deteriorates producing an output beam having an asymmetric or multipeaked intensity distribution. This results in a reduced efficiency of coupling of light emitted by the device into an optical fiber.

SUMMARY OF THE INVENTION

A light emitting device comprises a substrate, a first confining layer overlying the substrate, an active layer overlying the first confining layer, a second confining layer overlying the active layer and a capping layer overlying the second confining layer. The improvement comprises the interposition of an absorber layer, which aborbs light at the wavelength of the emission, between the substrate and the first confining layer and a capping layer which aborbs light at the wavelength of the emission. The improved device emits an output beam which has a narrow angular intensity pattern in the plane perpendicular to the plane of the layers and to the end surfaces of the device.

DETAILED DESCRIPTION OF THE INVENTION

Figure 1:
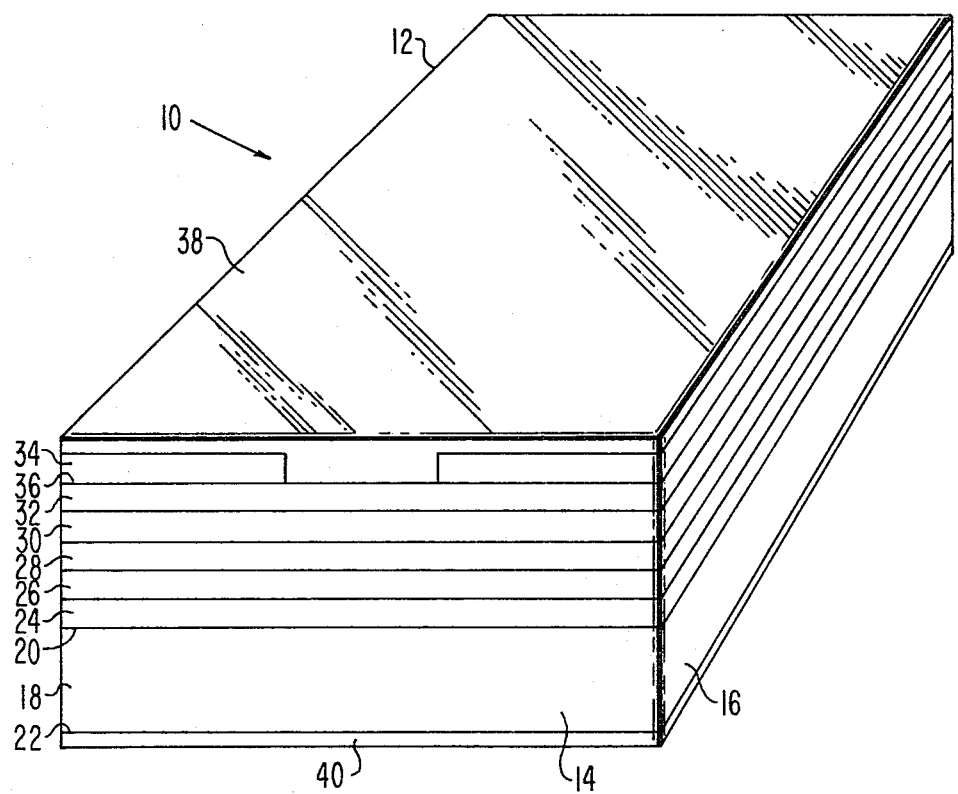
FIG. 1 is a schematic illustration of a perspective view of a light emitting device incorporating the present invention.

Referring to FIG. 1, a light emitting device 10 comprises a body 12 of single crystal semiconductor material, generally composed of group III-V compounds or alloys of such compounds in the form of a parallelopiped. The semiconductor body 12 typically comprises spaced parallel end surfaces 14 which are reflecting to light with at least one of the end surfaces being partially transparent so that light may be emitted from the semiconductor body 12 and parallel side surfaces 16 which extend between and are perpendicular to the end surfaces 14.

The body 12 includes a substrate 18 of one conductivity type, such as n-type, having spaced parallel major surfaces 20 and 22 which extend between and are perpendicular to both the end surfaces 14 and the side surfaces 16 and the body 12. The substrate 18 is transparent at the wavelength of the light emitted by the device. An absorber layer 24 of the same conductivity type as the substrate 18 overlies the first major surface 20 of the substrate 18. The absorber layer 24 absorbs light at the wavelength of the light generated by the device. A first confining layer 26 of the same conductivity type as the substrate 18 overlies the absorber layer 24 and is transparent at the wavelength of the light emitted by the device. An active layer 28 overlies the first confining layer 26 and may be of the same conductivity type as the first confining layer 26 or of the opposed conductivity type. A second confining layer 30, having the opposite conductivity type to that of the substrate 18, overlies the active layer 28 and is transparent at the wavelength of light emitted by the device. A capping layer 32 of the same conductivity type as the second confining layer 30 overlies the second confining layer 30. The capping layer 32 absorbs light at the wavelength of the light generated by the device and provides a good ohmic contact. An electrical isolation layer 34 overlies the upper surface 36 of the capping layer 32 and has an opening therethrough in the form of a stripe extending down to and exposing the surface 36 of the capping layer 32. An electrically conducting layer 38 overlies the electrical isolation layer 34 and extends down into the opening in the electrical isolation layer 34 thereby providing electrical contact to the surface 36 of the capping layer 32. A second electrically conducting layer 40 overlies the second major surface 22 of the substrate 18 to make electrical contact to the substrate.

The substrate 18 is typically composed of a Group III-V material such as n-type conductivity InP where the n-type dopant is Sn or S in a concentration of about $5-30 \times 10^{18}$ carriers per cubic centimeter. InP is a preferred substrate material since a class of alloys which emit radiation in the 1.2 micrometer to 1.7 micrometer wavelength range may be lattice matched to InP. Other substrates which have this capability are also useful.

The absorber layer 24 is composed of a Group III-V material, typically between about 0.5 micrometer and about 2 micrometers thick, which absorbs light at the wavelength of the emitted light and has a bandgap wavelength longer than the emission wavelength. Antypas, referred to above, has disclosed the bandgap energy versus lattice constant for alloys of In, Ga, As and P which can be lattice matched to InP. If the susbstrate is n-type InP, the absorber layer may be an InGaAsP or InGaAs alloy doped with S, Se, Te or Sn to a concentration between about $10^{17}$ and about $10^{18}$ carriers per cubic centimeter.

The first and second confining layers 26 and 30 are typically between about 0.5 micrometer and about 2 micrometers thick, are composed of Group III-V materials which are transparent at the wavelength of the light emitted by the device and have an index of refraction at this wavelength which is less than that of the active layer. If the substrate 18 is composed of InP, the confining layers 26 and 30 are preferably also composed of InP since the lattice match to the substrate is automatically obtained. Since the emission from the active layer occurs at a wavelength longer than the bandgap wavelength of InP, InP confining layers will also be transmissive at the emission wavelength. Other ternary or quaternary alloys of In, Ga, As and P could also be used.

The active layer 28 is typically composed of an alloy of In, Ga, As and P which emits light at a particular wavelength which is longer than the bandgap wavelength of the substrate material, and which can be approximately lattice matched to the substrate. The active layer 28 is typically undoped and contains between about 5 and about $20 \times 10^{15}$ carriers per cubic centimeter. For an incoherent light emitting diode the thickness of the active layer is between about 0.03 micrometer and about 0.5 micrometer, while for an injection laser diode the thickness is typically between about 0.1 micrometer and about 0.5 micrometer.

The capping layer 32 is typically composed of an ternary or quaternary alloy of In, Ga, As and P between about 0.2 micrometer and about 2 micrometers thick which can be approximately lattice matched to the substrate. For a p-type conducting second confining layer the capping layer is also p-type conducting, typically containing between about 1 and about $10 \times 10^{18}$ Zn atoms per cubic centimeter. If the concentration of acceptor atoms is much less than $10^{18}$ atoms per cubic centimeter, the contact resistance and therefore heating of the device increases. If the concentration is much greater than about $10 \times 10^{18}$ atoms per cubic centimeter, Zn diffusion through the upper confining layer and the active layer into the lower confining layer may occur. This would move the recombination region from the active layer into the first confining layer thereby fixing the emission wavelength at the bandgap wavelength of the confining layer.

The electrical isolation layer 34 may be composed of an electrically insulating material such as silicon dioxide formed by the decomposition of silane in an oxygen atmosphere. Alternatively, this layer may be formed of a semiconductor material which is lattice matched to, and of the opposite conductivity type to, the capping layer 32. In this latter case the application of a forward bias between the electrically conducting layers 38 and 40 will cause the p-n junction between the isolation layer 34 and the capping layer 32 to be reverse biased thereby preventing current flow from the conducting layer 38 to the capping layer 32 through the isolation layer 34 and confining the current flow to the opening in the isolation layer. In this latter case the isolation layer is composed of a semiconductor material typically about 1 micron thick and having the same conductivity type as the substrate. If the substrate is n-type InP, the isolation layer may also be n-type InP doped with Sn and having between about 1 and about $10 \times 10^{17}$ carriers per cubic centimeter.

The electrically conducting layers 38 and 40 form ohmic electrical contact to the capping layer and the substrate respectively. For a light emitting device fabricated on an n-type InP substrate the electrically conducting layer 38 may be composed of a Au-Zn alloy typically deposited by evaporation, followed by the sequential deposition of Cr, Pt and Au. The electrically conducting layer 40 may be composed of a Au-Sn alloy deposited, for example, by evaporation.

One of the opposed end faces 14 of the light emitting device 10 which is partially transmissive at the wavelength of the light emitted by the device may be coated with a protection layer composed of $Al_2O_3$ or a similar material having a thickness of about ½ wave at the emission wavelength. Such a coating has been disclosed by Ladany et al in U.S. Pat. No. 4,178,564 issued Dec. 11, 1979 and entitled "HALF WAVE PROTECTION LAYERS ON INJECTION LASERS", which is incorporated herein by reference. The opposed end face may be coated with a light reflector which is reflecting at the emission wavelength. This light reflector may consist of a layer of an electrical insulator such as silicon dioxide or aluminum oxide coated with a layer of gold or alternatively, the light reflector may be a multi-layered reflector such as that disclosed by Ettenberg in U.S. Pat. No. 4,092,659 issued May 30, 1978 and entitled "MULTI-LAYER REFLECTOR FOR ELECTROLUMINESCENT DEVICE", which is incorporated herein by reference.

In the operation of the light emitting device the application of a forward bias voltage between the conducting layers 38 and 40 results in the injection of carriers into the active layer 28 where light is generated upon recombination of the carriers. As the thickness of the active region is decreased the evanescent tails of the various propagating optical modes spread into the upper and lower confining layers and into the absorber and capping layers. Those modes which are propagating off-axis are preferentially absorbed in the absorber and capping layers thus producing a symmetric beam. Devices fabricated in this way exhibited a narrow output beam perpendicular to the plane of the active layer.

The improved light emitting device of the invention may be fabricated using liquid phase epitaxial techniques such as are disclosed by Lockwood et al in U.S. Pat. No. 3,753,801 issued Aug. 21, 1973 and entitled "METHOD OF DEPOSITING EPITAXIAL SEMICONDUCTOR LAYERS FROM THE LIQUID PHASE", or by vapor phase epitaxial techniques such as those disclosed by Olsen et al in U.S. Pat. No. 4,116,733 issued Sept. 26, 1978 and entitled "VAPOR PHASE GROWTH TECHNIQUE OF III-V COMPOUNDS UTILIZING A PREHEATING STEP".

EXAMPLE

A light emitting device of the invention which emitted light at about 1.31 micrometers and had absorber and capping layers with a bandgap wavelength of about 1.67 micrometers was fabricated by sequentially depositing the layers using the vapor phase epitaxial growth technique disclosed by Olsen et al. The substrate was n-InP; the absorber layer was n-type $In_{0.53}Ga_{0.47}As$ about 0.4 micrometer thick; the first confining layer was n-type InP about 1.0 micrometer thick; the active layer was undoped $In_{0.72}Ga_{0.28}As_{0.57}P_{0.43}$ about 0.18 micrometer thick; the second confining layer was p-type InP about 1.1 micrometers thick; and the capping layer was p+ type $In_{0.53}Ga_{0.47}As$ about 0.4 micrometer thick.

For the common constituents of the layers and the dopants the gas flows in the deposition zone were: 40 cubic centimeters per minute (ccpm) of HCl over In metal heated to 850° C.; and 114 ccpm of 10 percent by volume of $PH_3$ in $H_2$. The n-type dopant was S introduced as 100 ppm $H_2S$ in $H_2$ at 80 ccpm. The p-type dopant was Zn introduced by flowing $H_2$ at 1000 ccpm over Zn metal heated to about 380° C. for the second confining layer and heated to between about 420° C. and about 450° C. for the capping layer.

The composition of the InGaAsP active layer was obtained adding 13 ccpm of 10% HCl gas in $H_2$ over Ga metal (heated to 850° C.) and 83 ccpm of 10% $AsH_3$ in $H_2$ (heated to 850° C.) added to the HCl over In and $PH_3$ flows above. For the absorber and capping layers 24 and 32 a gas mixture of 10 percent by volume of $AsH_3$ in $H_2$ (heated to 850° C.) had a flow rate of 285 ccpm while the HCl gas flow over the metals were 22 ccpm over In (heated to 850° C.) and 28 ccpm of 10% HCl over Ga (heated to 850° C.).

The electrical isolation layer on the capping layer was formed by pyrolitic decomposition of silane in an oxygen atmosphere. The electrical contact to the capping layer was formed by evaporation of a Au Zn alloy. The electrical contact to the substrate was formed by evaporation of a Au Sn alloy.

Figure 2:
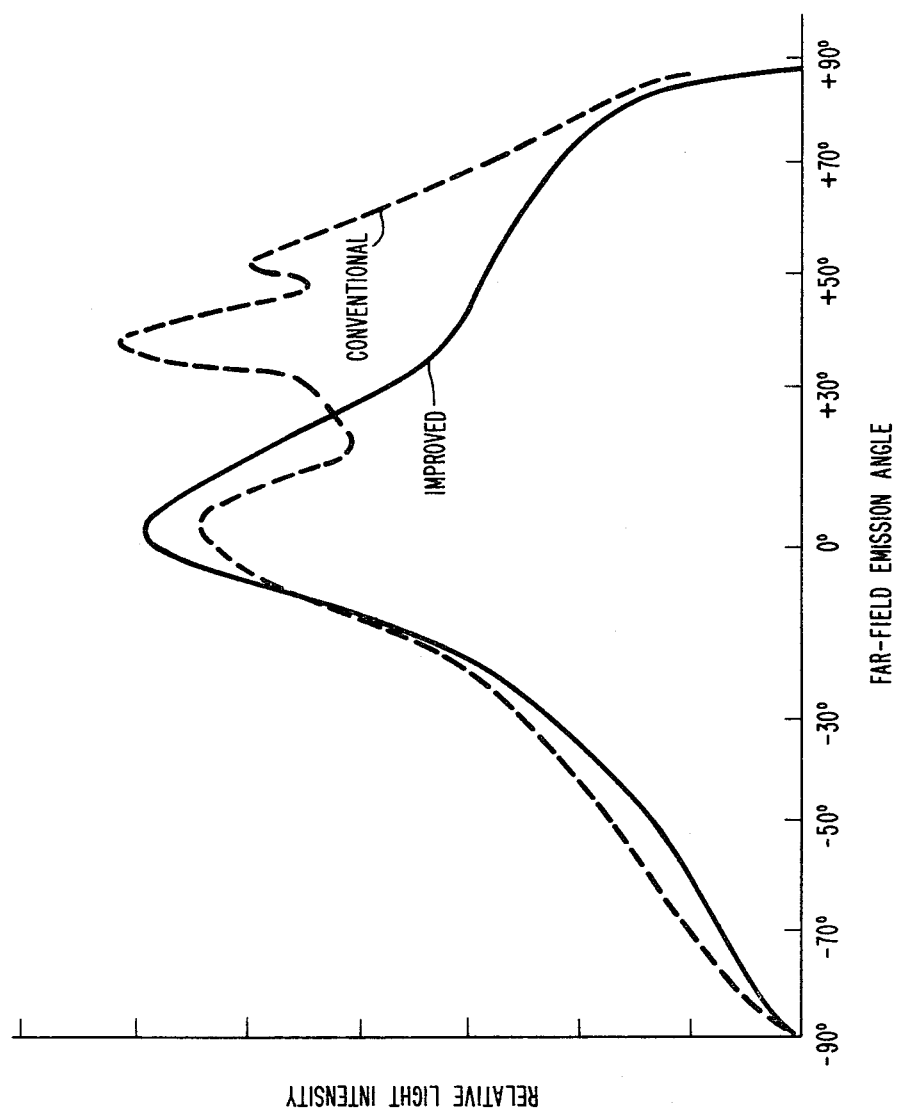
FIG. 2 is a graphical illustration of the angular dependence of the output light intensity of a conventional and an improved light emitting device.

FIG. 2 is a graphical illustration of the angular far field intensity pattern of the output light beam of a light emitting device of the invention and of a conventional device. The far field emission angle is the angle away from the normal to the face of the device through which the light beam is emitted. The conventional light emitting device was composed of InP first and second confining layers and $In_{0.72}Ga_{0.28}As_{0.57}P_{0.43}$ active layers. From the FIGURE it can be seen that the output beam of the improved device has both a more symmetric and a narrower angular intensity pattern as compared to the conventional device.

We claim:

1. In a light emitting device comprising:
  a semiconductor substrate having two major surfaces;
  a first confining layer, overlying a first major surface of the substrate;
  an active layer overlying the first confining layer;
  a second confining layer overlying the active layer;
  a capping layer overlying the second confining layer;
  an electrical isolation layer overlying the capping layer and having an opening therethrough wherein the capping layer is exposed;
  an electrically conducting layer overlying the capping layer in the opening in the isolation layer whereby electrical contact is made to the capping layer; and
  an electrically conducting layer overlying the second major surface of the substrate whereby electrical contact is made to the substrate;
  wherein the substrate and the first confining layer are of one conductivity type and the second confining layer and the capping layer are of the opposite conductivity type; and
  wherein the substrate and the first and second confining layers are composed of a material transparent at the wavelength of a light beam emitted by the device;
  the improvement which comprises:
  an absorber layer composed of a material which is absorptive of light at the emitted wavelength interposed between the substrate and the first confining layer and of the same conductivity type as the substrate; and wherein the capping layer is absorptive of light at the emitted wavelength.

2. A light emitting device according to claim 1 wherein the substrate is InP and the active layer is composed of a material which emits light at a wavelength greater than about 1 micrometer.

3. A light emitting device according to claim 2 wherein the active layer is an InGaAsP alloy and the absorber and capping layers are composed of an InGaAsP alloy.

4. A light emitting device according to claim 2 wherein the active layer is an InGaAsP alloy and the absorber and capping layers are composed of an InGaAs alloy.

5. A light emitting device which comprises:
  a substrate composed of InP and having two major surfaces;
  an absorber layer overlying a major surface of the substrate, composed of an InGaAs alloy;
  a first confining layer, overlying the absorber layer, composed of InP;
  an active layer, overlying the first confining layer, composed of an InGaAsP alloy;
  a second confining layer, overlying the active layer, composed of InP;
  a capping layer, overlying the second confining layer, composed of an InGaAs alloy;
  an electrical isolation layer overlying the capping layer and having an opening therethrough wherein the capping layer is exposed;
  an electrically conducting layer overlying the capping layer in the opening in the isolation layer whereby electrical contact is made to the capping layer; and
  an electrically conducting layer overlying the second major surface of the substrate whereby electrical contact is made to the substrate;
  wherein the substrate, the absorber and the first confining layers are of one conductivity type and the second confining layer and the capping layer are of the opposite conductivity type; and
  wherein the substrate and the first and second confining layers are transparent at the wavelength of a light beam emitted by the device and the absorber and capping layers are absorptive of light at this wavelength.

6. A light emitting device according to claim 1 or 5 wherein the isolation layer is composed of an electrically insulating material.

7. A light emitting device according to claim 1 or 5 wherein the isolation layer is composed of a semiconductor material having the opposite conductivity type to the conductivity type of the capping layer.

8. A light emitting device according to claim 1 or 5 further comprising:
  a protection layer overlying an end face of the light emitting device which is partially transmissive at said wavelength.

9. A light emitting device according to claim 8 further comprising a light reflector overlying an end face of the light emitting device opposed to the end face having the protection layer thereon.

* * * * *

UNITED STATES PATENT AND TRADEMARK OFFICE
CERTIFICATE OF CORRECTION

PATENT NO. : 4,359,774

DATED : November 16, 1982

INVENTOR(S) : Gregory Hammond Olsen; Dan Botez

It is certified that error appears in the above-identified patent and that said Letters Patent is hereby corrected as shown below:

Column 1, line 22, "Ettenburg" should be -- Ettenberg --.

Column 2, line 61, "$10^5$" should be -- $10^{17}$ --.

Column 5, line 68, delete "composed of a material".

Column 6, line 8, after "capping layer", insert -- composed of a material --.

Signed and Sealed this

Seventh Day of June 1983

[SEAL]

Attest:

DONALD J. QUIGG

Attesting Officer

Acting Commissioner of Patents and Trademarks